United States Patent
Yamazaki et al.

[11] Patent Number: 6,037,197
[45] Date of Patent: Mar. 14, 2000

[54] PREPARATION METHOD OF SEMICONDUCTOR DEVICE

[75] Inventors: Shunpei Yamazaki, Tokyo; Yoshiharu Hirakata, Kanagawa, both of Japan

[73] Assignee: Semiconductor Energy Laboratory Co., Ltd., Kanagawa-ken, Japan

[21] Appl. No.: 09/114,222

[22] Filed: Jul. 13, 1998

[30] Foreign Application Priority Data

Jul. 14, 1997 [JP] Japan ................................... 9-205344

[51] Int. Cl.[7] .................................................. H01L 21/00
[52] U.S. Cl. .......................... 438/151; 438/152; 438/166; 438/308
[58] Field of Search ..................................... 438/151, 152, 438/153, 154, 166, 158, 308, 635

[56] References Cited

U.S. PATENT DOCUMENTS

| | | | |
|---|---|---|---|
| 5,587,330 | 12/1996 | Yamazaki | 437/41 |
| 5,830,786 | 11/1998 | Zhang et al. | 438/163 |
| 5,877,083 | 3/1999 | Yamazaki | 438/635 |
| 5,893,730 | 4/1999 | Yamazaki et al. | 438/166 |
| 5,926,735 | 7/1999 | Yamazaki et al. | 438/635 |

FOREIGN PATENT DOCUMENTS 7-294958  11/1995  Japan .

*Primary Examiner*—John F. Niebling
*Assistant Examiner*—Michael S. Lebentritt
*Attorney, Agent, or Firm*—Eric J. Robinson; Sixbey, Friedman, Leedom & Ferguson, P.C.

[57] ABSTRACT

A preparation method of a semiconductor device comprising a substrate having formed thereon plural semiconductor elements formed in a matrix form and plural pixel electrodes each connected to each semiconductor element and a liquid crystal layer held on the substrate, comprising

- a step of forming the plural pixel electrodes on an interlayer dielectric,
- a step of heat-treating the plural electrodes to form hillocks and whiskers on the surfaces of the electrodes, and
- a step of removing the hillocks and the whiskers to flatten the electrode surfaces.

The semiconductor device is suitably used for, for example, a reflection type LCD apparatus with pixel electrodes having a good light reflectance and a high anti-brittleness.

17 Claims, 9 Drawing Sheets

ADDITION OF P OR B IONS

PREPARATION METHOD OF SEMICONDUCTOR DEVICE

FIELD OF THE INVENTION

The present invention relates to a preparation method of a liquid crystal display apparatus of an active matrix type and also to a preparation method of a semiconductor device for improving the image quality of the display images of an active matrix display apparatus using a thin-film transistors.

BACKGROUND OF THE INVENTION

In an active matrix type liquid crystal display apparatus, each thin-film transistor (TFT) is disposed to each of plural pixels disposed in a matrix form and the charge coming from and entering each pixel electrode is controlled by a switching function of TFT.

The fundamental constitution of the active matrix liquid crystal display apparatus is composed of two substrates facing each other, one of them is called a TFT substrate having a pixel region and the other is called a counter substrate. The TFT substrate is constituted by a pixel region containing several tens to several millions of pixel switching TFTs (hereinafter, is referred to as pixel TFTs) and a peripheral driving circuit region containing plural TFTs driving them.

An oriented film is formed on the TFT substrate and the counter substrate and an orientation treatment such as rubbing, etc., for arranging the orienting property of the liquid crystal material is carried out. It is desirable that the surfaces of the TFT substrate and the counter substrate directly before forming the oriented film thereon have planes as flat as possible because the surface states relates to the orientation of a liquid crystal.

Thereafter, to keep the distance between the TFT substrate and the counter substrate, spherical spacers are uniformly scattered on one of the TFT substrate and the counter substrate. Then, the two substrates are adhered to each other by a sealing material, after dividing the assembly, a liquid crystal material is filled between the TFT substrate and the counter substrate, and the liquid crystal inlet is sealed by a sealing material.

As the main heat treatments carried out in the above-described processes, there are;

burning of the oriented films (after keeping for one hour at 180° C., the film is gradually cooled to normal temperature), the heat press at adhering the substrates (after keeping for 3 hours at 160° C., the temperature is gradually lowered to 100° C. over a period of 2 hours, and then the temperature is gradually lowered to normal temperature over a period of 2 hours), and Burning for making a re-orientation treatment (after keeping for 30 minutes at 120° C., the film is gradually cooled to normal temperature).

In the case of making a reflection type LCD wherein a metal material is used as the pixel electrode, the light reflectance of the surfaces of the electrodes is lowered by the above-described heat treatments.

In the reflection type LCD, there are various display modes of a liquid crystal and, for example, there is a display mode of attaching importance to reflect the polarized component of light at the pixel electrodes as an ECB (electric field control birefringence) mode.

Accordingly, even when lowering of the reflectance of light is slight, it gives an influence on the polarized component of light and further it gives a bad influence on the display.

As described above, because in the reflection type LCD, the reflectance of the pixel electrodes is important, it has become a problem that the reflectance is lowered by the heat treatments.

The cause of lowering the light reflectance at the surfaces of the electrodes is explained below.

That is, when the pixel electrodes are formed with aluminum which is a material having a high reflectance and a low resistance, by the influence of the heat treatment after forming the pixel electrodes or the heat treatment in a cell-assembling process, hillocks or whiskers forms on the surfaces of the electrodes caused by the abnormal growth of aluminum. This is the main cause of lowering the reflectance of light by the heat treatment.

Now, the term "hillocks" is a phenomenon that swells form by colliding with each other of the growing components of aluminum. Also, the term "whiskers" is a phenomenon that a splinter-like growth occurs by the abnormal growth of aluminum.

The grown length of these hillocks and whiskers reaches several $\mu$m.

Thus, an experiment for determining the change of the reflectance of an aluminum alloy by a heat treatment (heat-treatment=one hour) was carried out. In the experiment, a film of Al—Ti(1%) formed at room temperature using a sputtering method was used. In the conditions at the film formation, an electric power was 3000 W and "T–S" was 150 mm at 0.4 Pa, wherein said "T–S" means a distance between a target and a sample.

Averages of the reflectances in the wavelength region of from 400 nm to 800 nm obtained in the experiment is shown in FIG. 10 as the light reflectance-baking temperature reliance of the film of Al—Ti(1%).

It can be seen from FIG. 10 that at the film formation (room temperature) of the film of Al—Ti(1%), the film has the light reflectance of from about 88 to 90% but because hillocks and whiskers form on the surfaces of the electrodes with the increase of the heat-treatment temperature (baking temperature), the light reflectance is lowered.

The light reflectance of aluminum in the visible light region is very high as compared with other metals and alloys (the reflectance of pure aluminum is from 92 to 93%), and is suitable for use as the pixel electrodes of the reflection type LCD.

In pure aluminum, hillocks are formed by a heat treatment of 100° C. or higher. Accordingly, hitherto, at least 0.5%, and preferably at least 2% titanium, scandium, or silicon is added to aluminum and the aluminum alloy is used as a material restraining the formation of hillocks.

As described above, when aluminum contains Ti, etc., hillocks are hard to form but on the other hand, the reflectance of the aluminum alloy is lowered by several percents as compared with pure aluminum as well as there occurs a problem that the resistance of such an aluminum alloy is increased.

Thus, hitherto, by the heat treatment processes (protective film formation, cell assembling, etc.) after the film formation of pixel electrodes composed of aluminum, hillocks form on the surface of the pixel electrodes and the light reflectance is lowered.

As described above, hitherto, in the case of using aluminum for pixel electrodes, hillock and whiskers are formed on the light-reflecting surfaces of the pixel electrodes to cause a problem of lowering the light reflectance.

SUMMARY OF THE INVENTION

That is, the present invention provide a preparation method of a reflection type liquid crystal display apparatus giving a good image quality wherein after forming pixel electrodes, hillocks and whiskers formed by applying a heat treatment to the pixel electrodes are removed by mechanical polishing typified by a CMP (chemical mechanical polishing) technique to form the pixel electrodes which are flat and have a high light reflectance.

Thus, according to a 1st aspect of the present invention, there is provided a preparation method of a semiconductor device, comprising

- a step of forming plural electrodes on an interlayer dielectric,
- a step of heat-treating the plural electrodes to form protrusions on the surfaces of the plural electrodes, and
- a step of removing the protrusions on the surfaces of the electrodes to flatten the surfaces.

Also, a 2nd aspect of the present invention, there is provided a preparation method of a semiconductor device comprising at least a substrate having plural semiconductor elements formed in a matrix form and plural pixel electrodes each connected to each of the plural semiconductor elements, and a liquid crystal layer held on the substrate, comprising

- a step of forming plural pixel electrodes on an interlayer dielectric,
- a step of heat-treating the plural pixel electrodes to form protrusions on the surfaces of the plural pixel electrodes, and
- a step of removing the protrusions on the surfaces of the plural pixel electrodes to flatten the surfaces.

Also, according to a practical aspect of the present invention, there is provided a production method of a semiconductor device, comprising

- a step of forming plural electrodes on a 1st interlayer dielectric,
- a step of heat-treating the plural electrodes to form protrusions on the surfaces of the plural electrodes,
- a step of forming a 2nd interlayer dielectric covering the plural electrodes, and
- a step of flattening the surfaces of the plural electrodes and the surface of the 2nd interlayer dielectric such that both the surfaces are in a same plane.

Also, in regard to the above-described flattening step, according to the present invention, there is provided a preparation method of a semiconductor device, which comprises removing the protrusions on the surfaces of the above-described electrodes and filling boundary portions or gaps among the plural electrodes with the above-described 2nd interlayer dielectric.

Furthermore, according to another practical aspect of the present invention, there is provided a preparation method of a semiconductor device, comprising

- a step of forming plural electrodes on a 1st interlayer dielectric,
- a step of forming a 2nd interlayer dielectric covering the plural electrodes,
- a step of flattening the surfaces of the plural electrodes and the surface of the 2nd interlayer dielectric such that both the surfaces are in a same plane and filling boundary portions or gaps among the plural electrodes with the 2nd dielectric film,
- a step of heat-treating the plural electrodes to form protrusions on the surfaces of the plural electrodes, and
- a step of removing the protrusions of the surfaces of the plural electrodes to flatten the surfaces.

DETAILED DESCRIPTION OF THE INVENTION

Then, the present invention described in detail.

The heat-treatment temperature and the treatment time of the electrodes in the present invention are determined by considering the heat-treatment temperature and the treatment time after forming the pixel electrodes. However, as a matter of course, the heat-treatment temperature is the temperature of the range of giving no influences on the characteristics of the thin-film transistors.

The treatment time at a high temperature is longest in the heat press (3 hours at 160° C.) at adhering the substrates and the highest temperature is 180° C. (one hour) at burning the oriented films.

Figure 10:
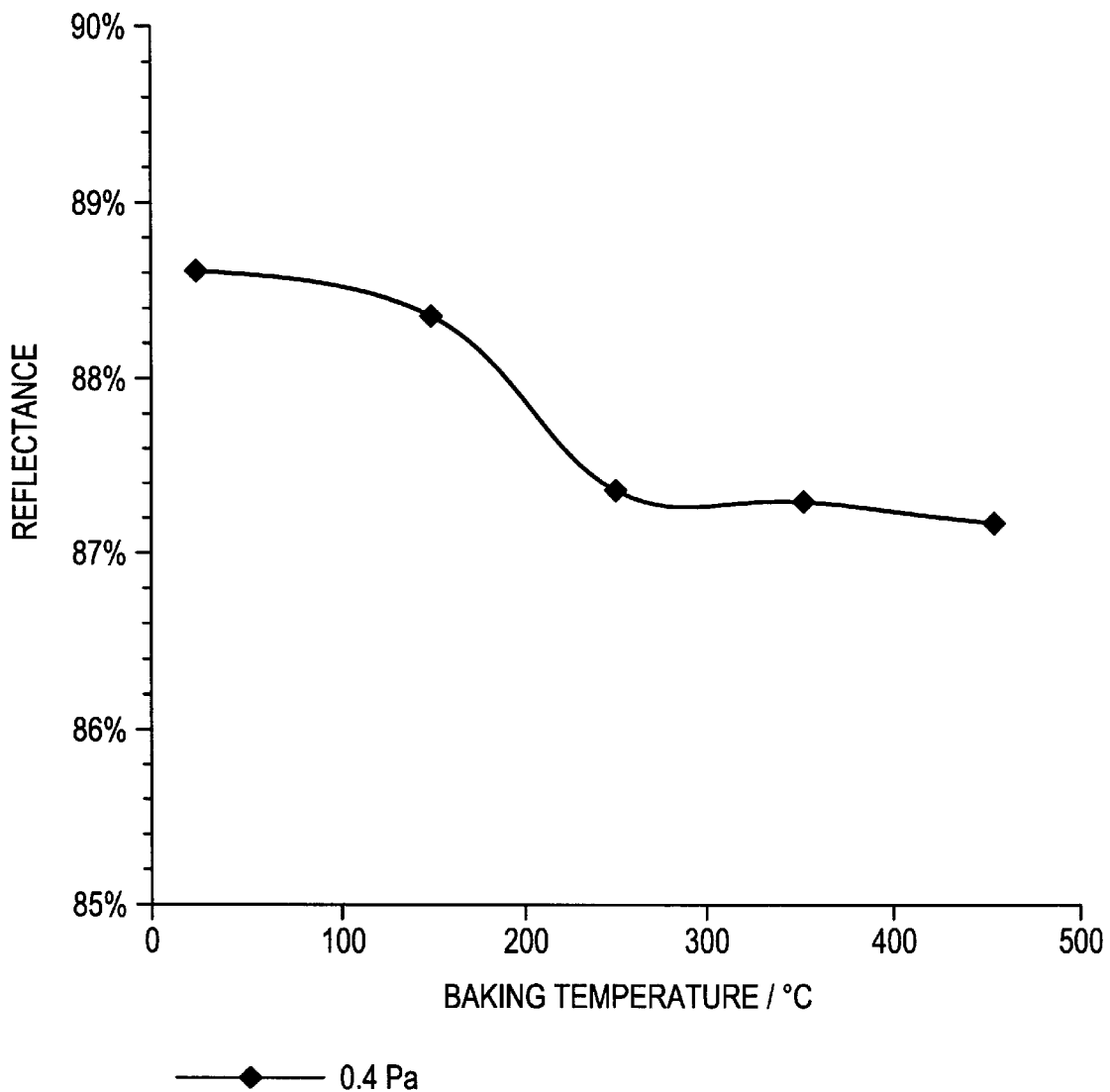
FIG. 10 is a graph showing a light reflectance-baking temperature reliance.

Also, from FIG. 10, it can be seen that with the treatment at a higher temperature, the light reflectance is lowered, from about 250° C., the reflectance becomes constant, and about 300° C., the formation of hillocks is stopped.

Accordingly, in regard to the heat-treatment temperature and the treatment time of the electrodes in the present invention, it is preferred that the electrodes are maintained for from 1 to 5 hours or longer while heating then at a temperature of from 160° C. to 300° C. to sufficiently form hillocks and whiskers.

It is preferred that the plural electrodes in the present invention are made up of a material comprising aluminum as the main constituent.

Also, the step of removing the hillocks and whiskers to flatten the surfaces of the electrodes in the present invention is preferably carried out by mechanical polishing.

By removing the hillocks and whiskers formed by the heat-treatment described above by mechanical polishing typified by a CMP technique, a reflection type liquid crystal display device having a high reflectance, having flat pixel electrodes, and showing a good image quality can be obtained.

Also, by heat treating at 180° C. (one hour), which is the highest temperature after the formation of the pixel electrodes to sufficiently form hillocks and removing the hillocks by mechanical polishing, at least polishing the pixel electrodes, hillocks are scarcely formed by a heat treatment and lowering of the reflectance can be prevented.

Furthermore, in the present invention, even when after forming hillocks by heat-treating at a low temperature of 160° C. or lower so that a bad influence is not given to the characteristics of thin-film transistors, the hillocks are removed by mechanical polishing typified by a CMP technique, flat pixel electrodes having a high reflectance as compared with conventional ones can be obtained.

In addition, as other effect of the present invention, by forming hillocks and whiskers by applying the heat treatment, the internal stress of the electrode films can be moderated and the same effect as annealing a metal can be obtained.

The annealing is to remove an internal stress of a material such as a metal, an alloy, a glass, etc., to render the material anti-brittle by softening the material or heat-treating the material for imparting a cold workability and cooling.

To sufficiently obtain the effect, it is preferred to thoroughly form hillocks by heat treating at a high temperature of 250° C. or higher, whereby the internal stress of the pixel electrodes is completely removed and the pixel electrodes having a good anti-brittle property can be obtained.

Thus, according to the present invention, pixel electrodes having a high light reflectance and a high anti-brittleness can be obtained, whereby a more reliance of the display images and more improvement of the image quality can be obtained.

The following examples are intended to illustrate the present invention but, as a matter of course, not to limit the invention in any way.

EXAMPLE 1

In the example, the example of the steps of preparing a pixel matrix circuit of a reflection type LCD by utilizing the present invention is explained by referring to FIGS. 1A to 1C, 2A, 2B and 3A to 3C. In addition, the present invention is a technique relating to flattening of pixels and hence the TFT structure itself is not limited to the example.

First, as a substrate 101 having an insulating surface, a silicon oxide film (not shown) is formed on a glass substrate as a underlayer in the present invention. On the substrate 101 are formed active layers 102 to 104 made up of a crystalline silicon film. In addition, in the example, 3 TFTs only are described but in fact, more than one million TFTs are formed in the pixel matrix circuit.

In the example, the crystalline silicon film is obtained by thermally crystallizing a noncrystalline silicon film. Also, by patterning the crystalline silicon film by an ordinary photolithographic process, the active layers 102 to 104 are obtained. In addition, in the example, in the case of carrying out the crystallization, a catalytic element (nickel) for promoting the crystallization is added. The technique is described in detail in Japanese Patent Publication (unexamined) No. 7-130652.

Then, as a gate insulating film 105, a silicon oxide film having a thickness of 150 nm is formed, an aluminum film (not shown) containing 0.2% by weight scandium is formed on the silicon oxide film, and an island-form pattern, which becomes the original mold of the gate electrode, is formed by patterning.

First, while leaving the resist mask used for patterning on the above-described island-form pattern, an anodic oxidation is carried out in an aqueous solution of 3% oxalic acid. In this case, a formation electric current of from 2 to 3 mV is passed using a platinum electrode as a cathode and the reached voltage is 8 volts. Thus, porous anodically oxidized films 106 to 108 are formed.

Thereafter, after removing the resist mask, an anodic oxidation is carried out in a solution obtained by neutralizing an ethylene glycol solution of 3% tartaric acid with aqueous ammonia. In this case, the formation electric current is from 5 to 6 mV and the reached voltage may be 100 volts. Thus, dense anodically oxidized films 109 to 111 are formed.

Figure 1A:
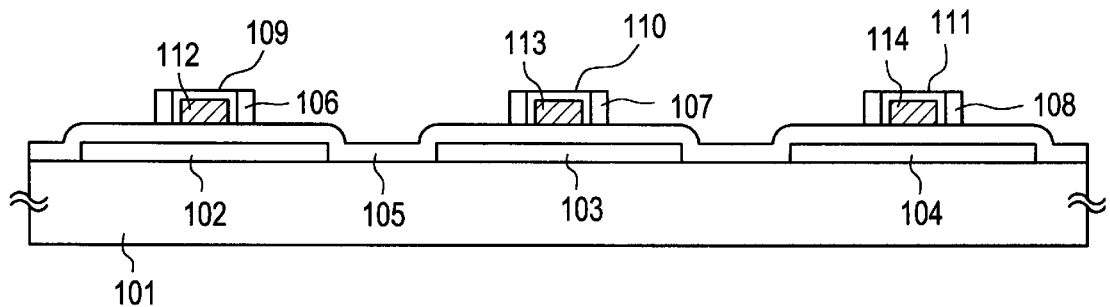
FIGS. 1A to 1C are views showing preparation steps of a reflection type LCD.

Also, by the above-described process, the gate electrodes 112 to 114 are demarcated. In addition, in the pixel matrix circuit, simultaneously with the formation of the gate electrode, a gate wire connecting each gate electrode per 1 is formed. (FIG. 1A).

Then, the gate insulating film 105 is subjected to etching using the gate electrodes 112 to 114 as the mask. The etching is carried out by a dry etching method using a $CF_4$ gas, thereby gate insulating films of the form shown by 115 to 117 are formed.

Also, in this state, impurity ions imparting one conductivity type is added by an ion injection method or a plasma doping method. In this case, when the pixel matrix circuit is constituted by an N-type TFT, P (phosphorus) ions may be added and when the pixel matrix circuit is constituted by a P-type TFT, B (boron) ions may be added.

In addition, the addition step of the impurity ion described above is carried out in two times. The first addition is carried out at a high accelerated voltage of about 80 KeV and the addition is controlled such that the peak of the impurity ions come under ends (projected portions each of which are not covered with the gate electrode and the dense anodically oxidized film) of the gate insulating films 115 to 117. Also, the second addition is carried out at a low accelerated voltage of about 5 KeV and the addition is controlled such that the impurity ion is not added under the ends (the projected portions) of the gate insulating films 115 to 117.

Figure 1B:
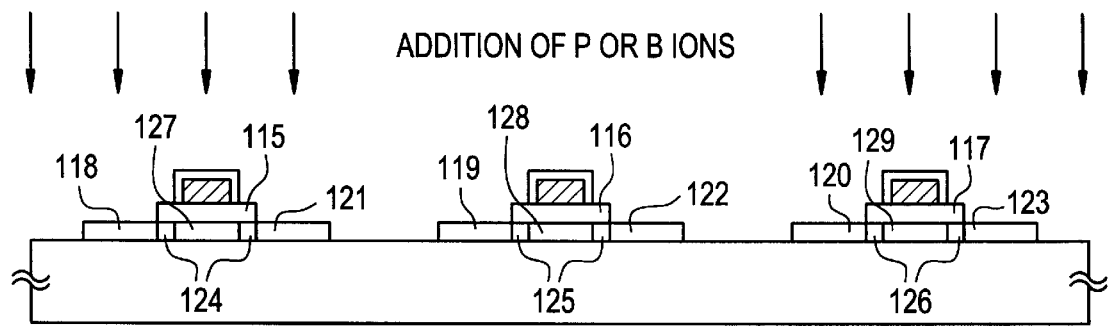

Thus, source domains 118 to 120 of TFT, drain domains 121 to 123, low-concentration impurity domains (also called LDD domains) 124 to 126, and channel-forming domains 127 to 129 are formed. (FIG. 1B)

In this case, it is preferred that in the source and drain domains, the impurity ion is added to an extent of obtaining a sheet resistance of from 300 to 500Ω/square. Also, it is necessary that the low-concentration impurity domain is optimized in conformity with the performance of TFT. Also, when the addition step of the impurity ion is finished, a heat treatment is carried out to perform the activation of the impurity ion.

Figure 1C:
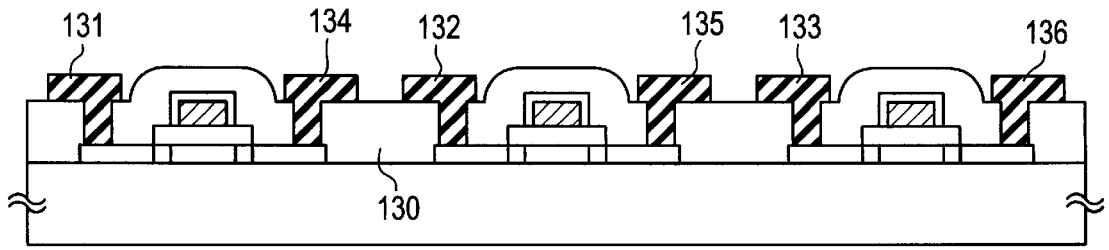

Then, as an interlayer dielectric 130, a silicon oxide film is formed at a thickness of 400 nm and on the film are formed source electrodes 131 to 133 and drain electrodes 134 to 136. (FIG. 1C)

Then, as a 1st interlayer dielectric 237, a silicon oxide film is formed at a thickness of from 0.5 to 1 μm. In the example, the 1st interlayer dielectric may be laminated films of films having an insulating property and there is no particular restriction on the film if the film or laminated films have an insulating property.

In addition, it is preferred to form the dense silicon oxide film utilizing a high-density plasma source, etc., because the flatness in the case of applying CMP polishing later is improved. Also, as the 1st interlayer dielectric 237, an organic resin film can be also used. As the organic resin film, polyimide, polyamide, polyimideamide, acrylic resin, etc., can be used.

Figure 2A:
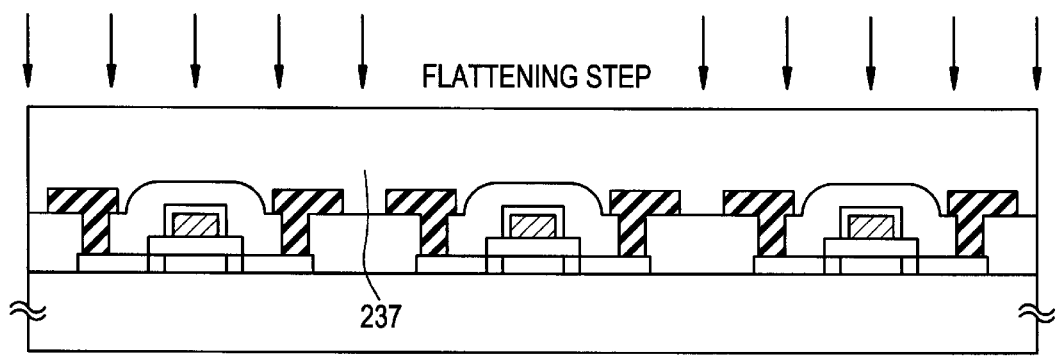
FIGS. 2A and 2B are views showing preparation steps of a reflection type LCD.

Thus, the flat 1st interlayer dielectric 237 is formed. Furthermore, a flatting treatment may be applied thereto. (FIG. 2A)

Figure 2B:
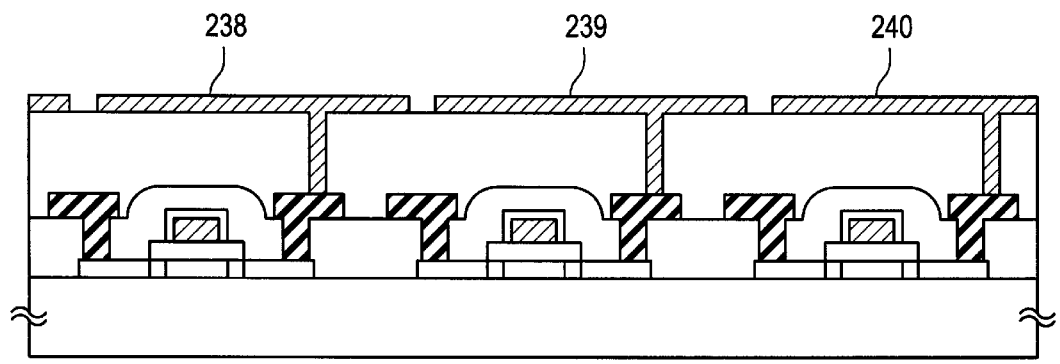

Then, an aluminum film added with 1% by weight titanium is formed at a thickness of 100 nm and pixel electrodes 238 to 240 are formed by patterning. As a matter of course, other metal material may be used. (FIG. 2B)

Then, the heat treatment of the pixel electrodes is carried out. In the heat-treatment temperature and the treatment time of the electrodes, the electrodes are kept for one hour by heating to a temperature of 180° C. to form hillocks and whiskers.

In the example, the electrodes were kept for one hour at 180° C. but there is no particular restriction if the heat treatment of a temperature of from 160° C. to 300° C. for at least one hour, preferably from 1 to 5 hours is applied. By the heat treatment, sufficient protrusions are formed.

In the case of using an organic resin film as the 1st interlayer dielectric, as the matter of course, the temperature of the heat treatment is lower than the temperature at which the resin is denatured or melted.

Figure 3A:
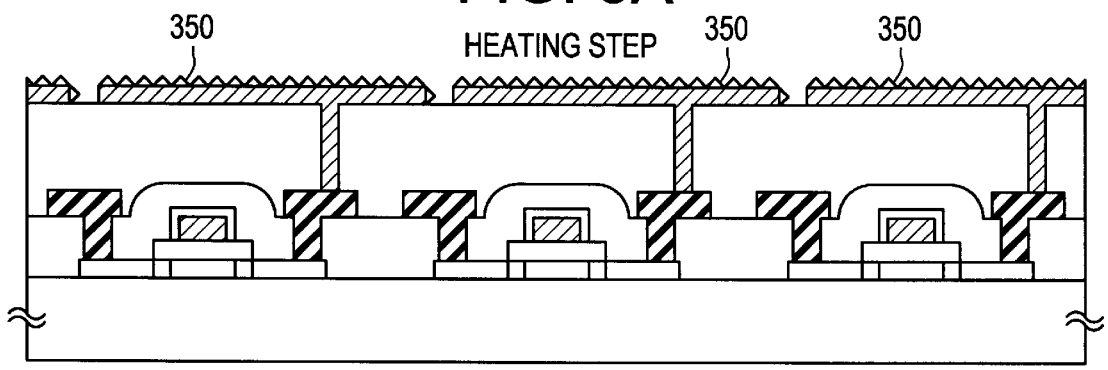
FIGS. 3A to 3C are views showing preparation steps of a reflection type LCD.

Thus, the state shown in FIG. 3A is obtained. As also shown in FIG. 3A, by the above-described heat treatment, protrusions 350 are formed on the surfaces of the pixel electrodes. To remove the protrusions (hillocks and whiskers), a CMP polishing step is carried out in the step described later.

At the stage of applying the CMP polishing step after forming the protrusions by the above-described heat treatment, it may be the construction of accomplished the pixel matrix circuit. However, in the example, after forming a lamination of the 1st interlayer dielectric and a 2nd interlayer dielectric, a CMP polishing step is carried out and gaps among the pixel electrodes 238 to 240 are filled with the insulating layer.

The 2nd interlayer dielectric 341 is formed covering the pixel electrodes 238 to 240. In the example, the 2nd interlayer dielectric may be laminated films of films having an insulating property and there is no particular restriction on the film if the film or the laminated films have an insulating property.

Also, as the 2nd interlayer dielectric 341, an organic resin film can be also used. As the organic resin film, polyimide, polyamide, polyimideamide, acrylic resin, etc., can be used.

In addition, when the pixel electrodes are formed on the source electrodes or wirings 131 to 133 such that the gaps among the pixel electrodes 238 to 240 are formed thereon, the source electrodes or wirings 131 to 133 function as a black mask and thus the insulating layer 341 may be transparent.

However, to ensure a more certain light-shielding function, it is desirable to use an interlayer dielectric having a light-shielding property such as an organic resin film (the film may be a solution-coated type silicon oxide film such as PSG, etc.) having dispersed therein a black pigment or carbon black as the 2nd interlayer dielectric 341. By employing such an interlayer dielectric, the ensure light-shielding function can achieved when the source electrodes or wirings become fine or to a light from an oblique direction.

Also, by using a material having a lower specific inductive capacity than that of a liquid crystal material as low as possible, the formation of a side-direction electric field among the pixel electrodes can be retained.

Figure 3B:
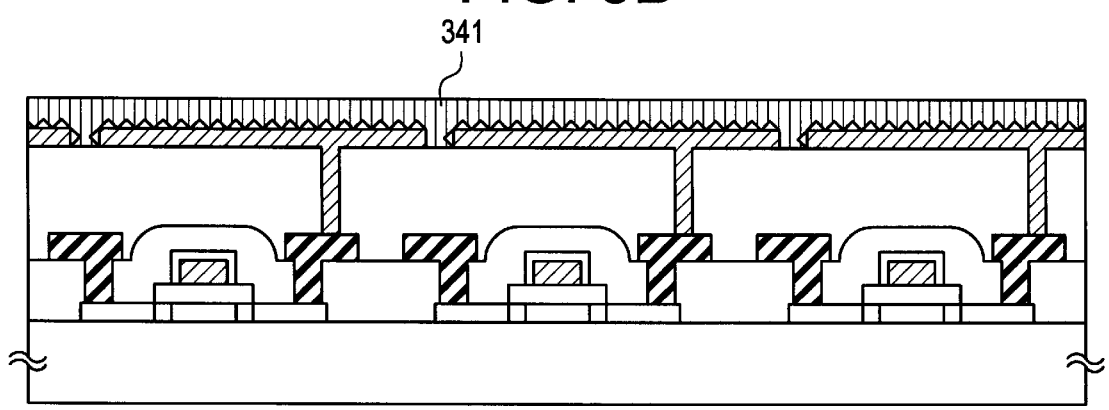
Figure 3C:
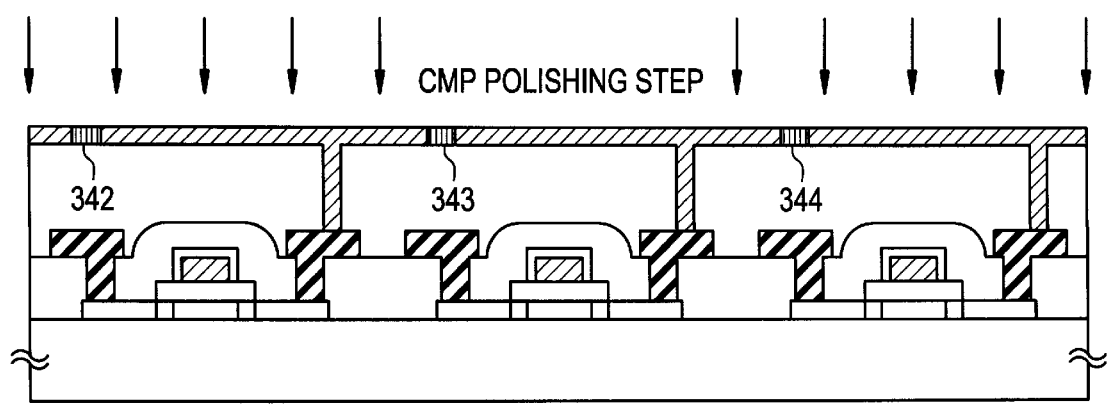

Thus, the state shown in FIG. 3B is obtained. When the state shown in FIG. 3B is obtained, a CMP polishing step is carried out and insulating layers 342 to 344 filled in the gaps among the pixel electrodes 238 to 240 are formed. In this case, because the surfaces of the pixel electrodes 238 to 240 almost coincide with the surfaces of the filled insulating layers 342 to 344, an excellent flat surface can be obtained. (FIG. 3C) Because by the CMP polishing step, the protrusions formed on the side surfaces of the electrodes cannot be removed, it is desirable that the heat-treatment temperature is controlled to form hillocks to an extent of not causing a short between the adjacent electrodes.

The pixel electrodes are disposed in a matrix form and the gaps (boundary portions) thereof are filled with the insulating layers 342 to 344. Accordingly, the filled insulating layers 342 to 344 are marked but actually, they are integrated in a matrix form.

As described above, the pixel matrix circuit is accomplished. In fact, driving circuits, etc., driving the pixel TFTs are simultaneously formed on the same substrate. Such a substrate is usually called a TFT side substrate or an active matrix substrate. In the specification, the active matrix substrate is referred to as the 1st substrate.

Figure 4:
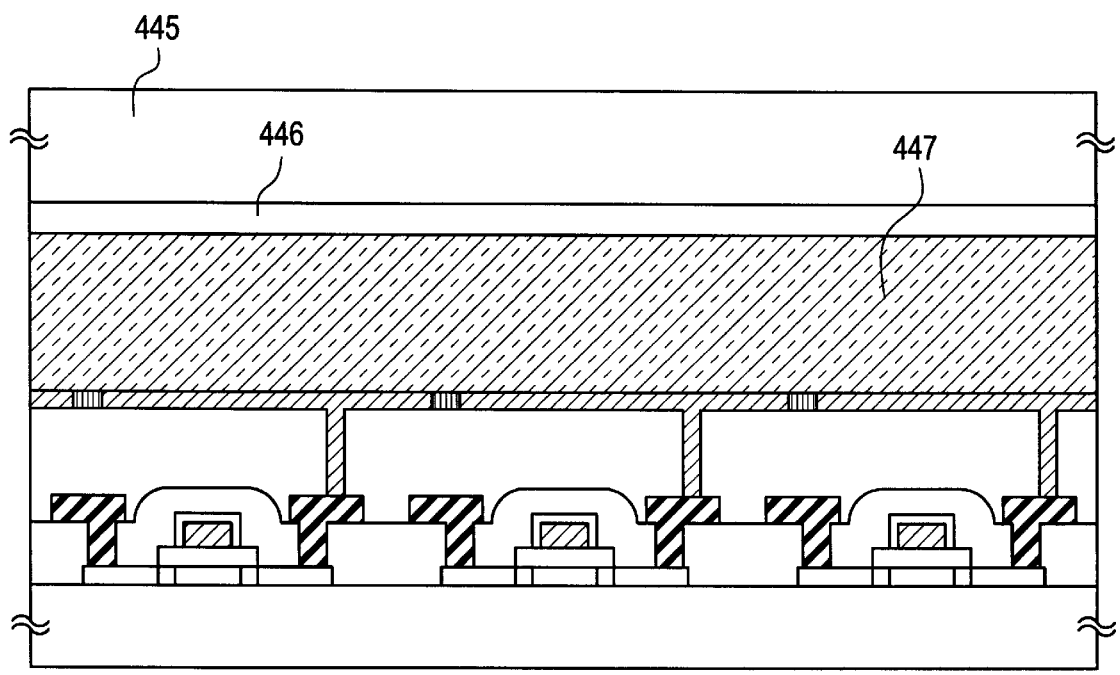
FIG. 4 is a view showing an embodiment of a reflection type LCD.

When the 1st substrate is accomplished, a counter substrate (in the specification, the substrate is referred to as the 2nd substrate) prepared by forming a counter electrode 446 on a light-transmitting substrate 445 is adhered to the 1st substrate and a liquid crystal layer 447 is sandwiched between them. Thus, the reflection type LCD as shown in FIG. 4 is accomplished.

In addition, the cell assembling process may be carried out according to a known method. Also, it is possible to disperse a dichromatic dye in the liquid crystal layer and also to form a color filter on the counter substrate. Because the kind of such a liquid crystal layer, the existence or absence of a color filter, etc., are changed according to the mode of driving the liquid crystal, they may be properly determined by an operator.

EXAMPLE 2

In Example 1, because the heat treatment is carried out after forming the pixel electrodes, protrusions are formed on the side surfaces of the pixel electrodes but in the present example, a constitution that protrusions are hard to form on the side surfaces of the electrodes is employed.

In this example, the steps of forming the pixel electrodes 238 to 240 are completely same as the steps in Example 1.

Also, a 2nd interlayer dielectric 241 is formed over the pixel electrodes 238 to 240. In the example, the 2nd interlayer dielectric may be laminated films of films having an insulating property and there is no particular restriction on the film if the film or the laminated films have an insulating property.

Also, as the 2nd interlayer dielectric 241, an organic resin film can be also used. As the organic resin film, polyimide, polyamide, polyimideamide, acrylic resin, etc., can be used.

In addition, when the pixel electrodes are formed on the source circuits 131 to 133 such that the boundary portions are formed thereon, the source circuits 131 to 133 function as a black mask and thus the insulating layer 241 may be transparent.

However, to ensure a more certain light-shielding function, it is desirable to use an interlayer dielectric having a light-shielding property such as an organic resin film (the film may be a solution-coated type silicon oxide film such as PSG, etc.) having dispersed therein a black pigment or carbon black as the 2nd interlayer dielectric 341. By employing such an interlayer dielectric, the ensure light-shielding function can achieved when the source circuits become fine or to a light from an oblique direction.

Also, by using a material having a lower dielectric constant than that of a liquid crystal material as low as possible, the formation of a side-direction electric field among the pixel electrodes can be retained.

Figure 5A:
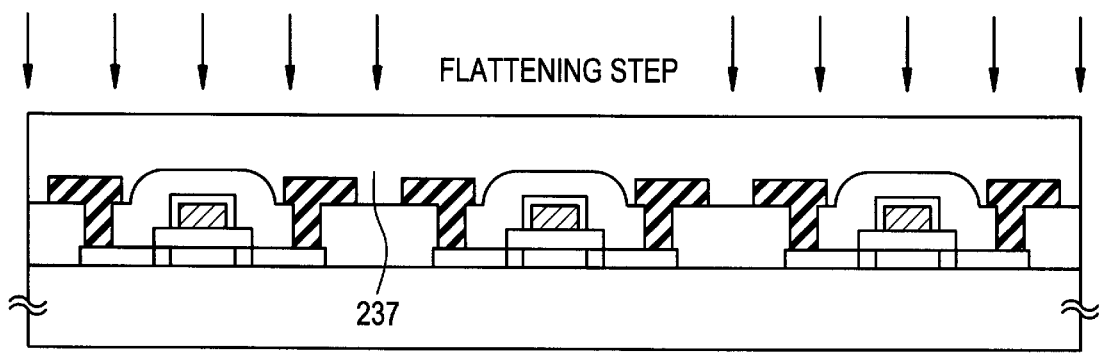
FIGS. 5A and 5B are views showing the preparation step of a reflection type LCD in Example 2.
Figure 5B:
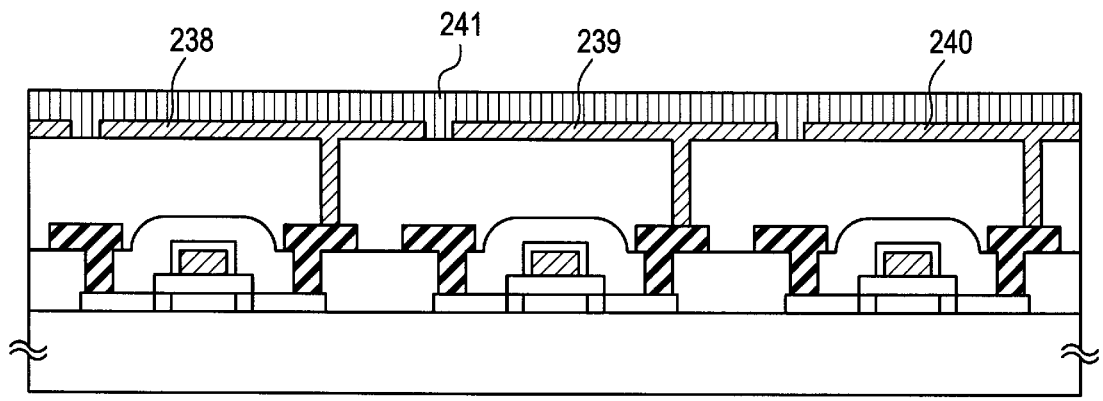
Figure 6A:
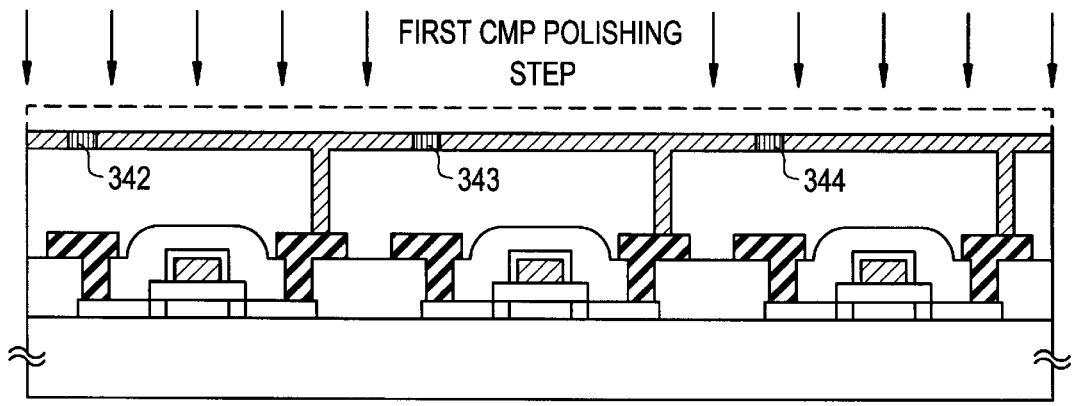
FIGS. 6A to 6C are views showing the preparation step of a reflection type LCD in Example 2.

Thus, the state shown in FIG. 5B is obtained. When the state shown in FIG. 5B is obtained, a 1st CMP polishing step is carried out and insulating layers 342 to 344 filled in the gaps among the pixel electrodes 238 to 240 are formed. In this case, because the surfaces of the pixel electrodes 238 to 240 almost coincide with the surfaces of the filled insulating layers 342 to 344, an excellent flat surface can be obtained. (FIG. 6A)

The pixel electrodes are disposed in a matrix form and the gaps (boundary portions) thereof are filled with the insulating layers 342 to 344. Accordingly, the filled insulating layers 342 to 344 are marked but actually, they are integrated in a matrix form.

Then, the heat treatment of the pixel electrodes is carried out. In the heat-treatment temperature and the treatment time of the electrodes, the pixel electrodes are maintained at a temperature of 180° C. for one hour to form hillocks and whiskers.

Different from Example 1, because the filled insulating layers exist, protrusions are scarcely formed at the side surfaces of the electrodes and even when the heat-treatment temperature is high, a short between the electrodes does not occur.

In the example, the electrodes were kept for one hour at 180° C. but there is no particular restriction if the heat treatment of a temperature of from 160° C. to 300° C. for at least one hour, preferably from 1 to 5 hours is applied. By the heat treatment, sufficient protrusions are formed.

In the case of using an organic resin film as the 1st interlayer dielectric, as the matter of course, the temperature of the heat treatment is lower than the temperature at which the resin is denatured or melted.

Figure 6B:
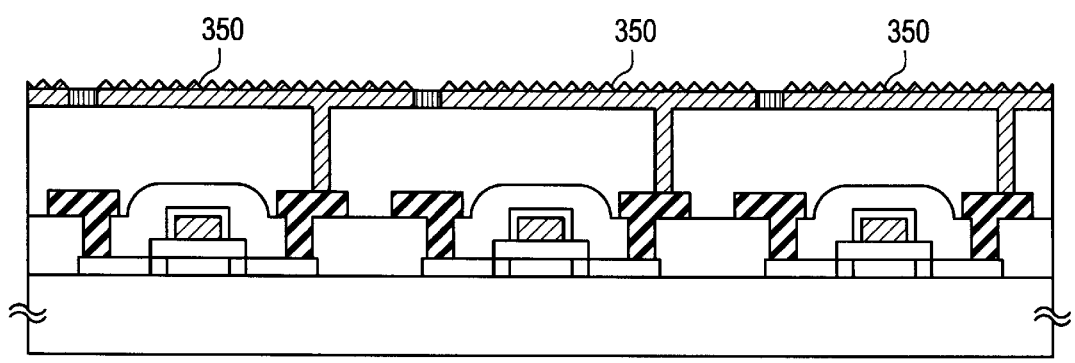
Figure 6C:
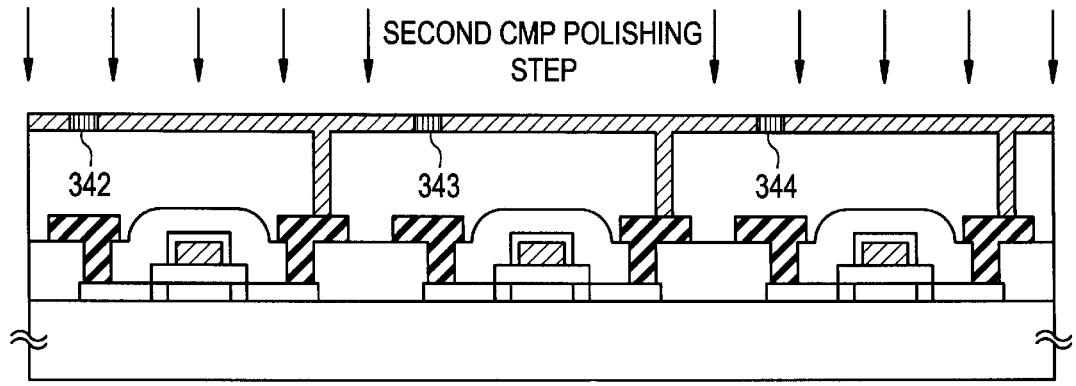

Thus, the state shown by FIG. 6B is obtained. As shown in FIG. 6, the protrusions 350 are formed on the surfaces of the pixel electrodes by the above-described heat treatment. To remove the protrusions (hillocks and whiskers), a 2nd CMP polishing step is carried out. (FIG. 6C)

Thereafter, a construction of further laminating a flattening film or a protective film may be employed.

As described above, the pixel matrix circuit is accomplished. Actually, driving circuits, etc., driving the pixel TFTs are simultaneously formed on the same substrate. Such a substrate is usually called a TFT side substrate or an active matrix substrate. In the specification, the active matrix substrate is called the 1st substrate.

Figure 7:
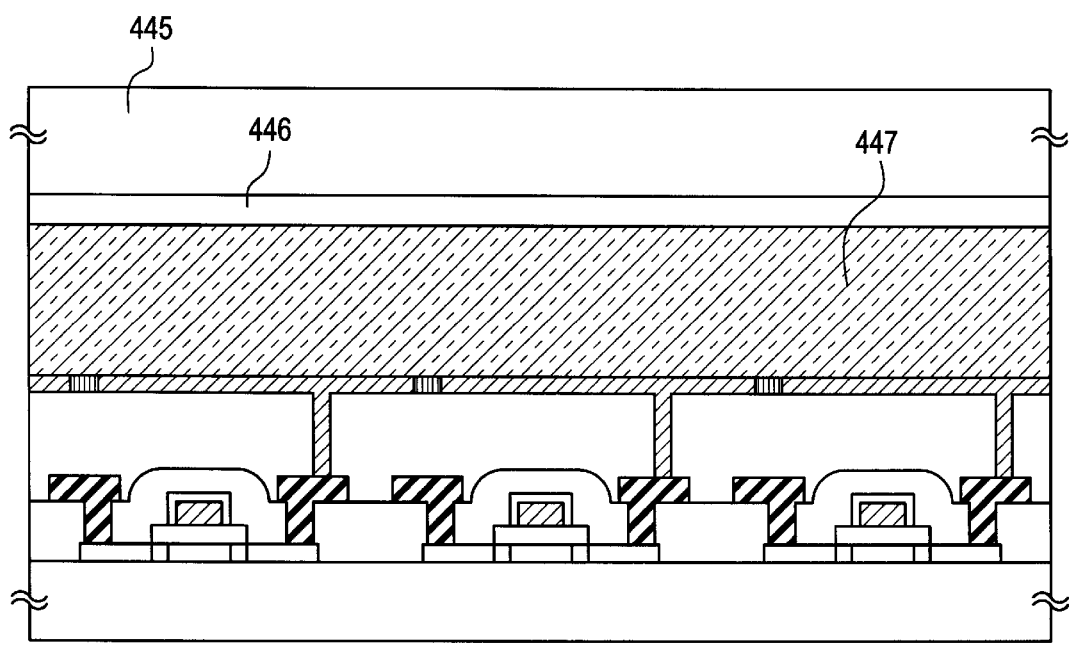
FIG. 7 is a view showing the reflection type LCD in Example 2.

When the 1st substrate is accomplished, a counter substrate (in the specification, the substrate is called the 2nd substrate) prepared by forming a counter electrode 446 on a light-transmitting substrate 445 is adhered to the 1st substrate and a liquid crystal layer 447 is sandwiched between them. Thus, the reflection type LCD as shown in FIG. 7 is accomplished.

EXAMPLE 3

In the example, an example of the case of utilizing a TFT of a different structure from that of the TFT shown in Example 1 as the semiconductor elements for carrying out the active matrix drive is explained.

In Example 1, an example of the coplanar type TFT, which was a typical top gate type TFT, was described but a bottom gate type TFT may be used. The example shown in FIG. 8 is an example of using an inverted staggered type TFT which is a typical example of a bottom gate type TFT.

Figure 8:
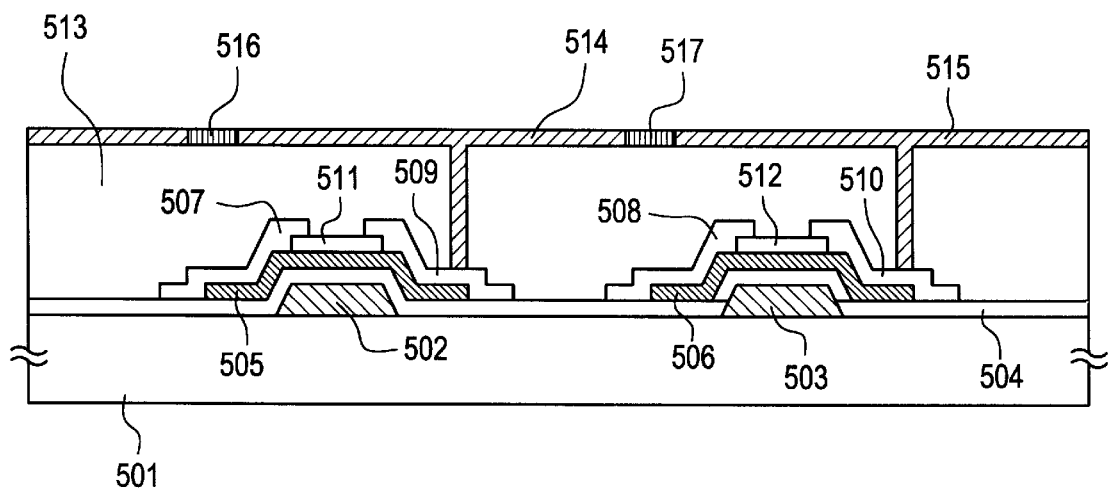
FIG. 8 is a view showing a preparation step of a bottom gate type TFT.

In FIG. 8, the numeral 501 is a glass substrate, 502 and 503 are gate electrodes, 504 is a gate insulating film, and 505 and 506 are active layers. The active layers 505 and 506 are constructed by a silicon film which does not intentionally contain an impurity.

Also, the numerals 507 and 508 are source electrodes, 509 and 510 are drain electrodes, and 511 and 512 are silicon nitride films which become channel stoppers (or etching stoppers). That is, in the active layers 505 and 506, the regions disposed under the channel stoppers 511 and 512 substantially function as channel-forming regions.

The above-described structure is the fundamental structure of the inverted staggered type TFT. In the example, a construction that such inverted staggered type TFTs are covered with an interlayer dielectric 513 made up of an organic resin film to flatten and pixel electrodes 514, 515 are formed thereon is employed. Also, the gaps among the pixel electrodes are filled with insulating layers 516, 517. As a matter of course, the heat treatment in the present invention is applied to form protrusions (hillocks and whiskers). Thereafter, the protrusions are removed and the pixel electrodes are flattened.

EXAMPLE 4

Also, in the example, an example of the case of forming an insulated gate type electric field effect transistors (IGFET) as the semiconductors in the present invention is explained. In addition, the IGFET is also called MOSFET and means a transistor formed on a silicon wafer.

Figure 9:
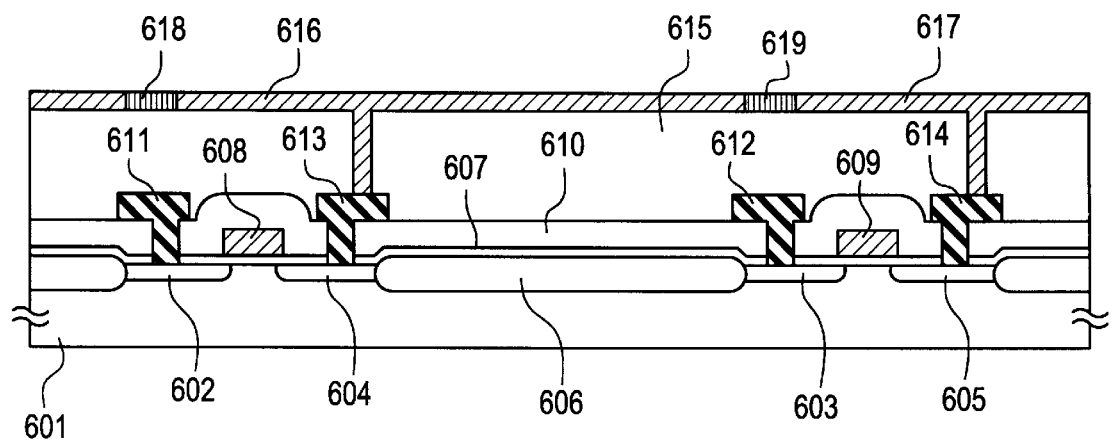
FIG. 9 is a view showing a preparation step of an IGFET.

In FIG. 9, the numeral 601 is a silicon substrate, 602 and 603 are source regions, and 604 and 605 are drain regions. The source region and the drain region are formed by adding an impurity by an ion injection method and by thermally diffusing the impurity. In addition, the numeral 606 is an oxide for the element separation and can be formed by an ordinary LOCOS technique.

Then, the numeral 607 is a gate insulating film, 608 and 609 are gate electrodes, 610 is a 1st interlayer dielectric, 611 and 612 are source electrodes, and 613 and 614 are drain electrodes. The electrodes are flattened with a 2nd interlayer dielectric 615 and pixel electrodes 616 and 617 are formed on the flat surfaces. The gaps between the pixel electrodes are filled with insulating layers 618 and 619. As a matter of course, the heat treatment in the present invention is applied to form protrusions (hillocks and whiskers). Thereafter, the protrusions are removed to flatten the pixel electrodes.

In addition, the present invention can be applied to other active matrix displays using a thin-film diode, an MIM element, a varistor element, etc., in addition to the IGFET, the top gate type TFT, and the bottom gate type TFT shown in the examples.

In particular, the reflection type liquid crystal LCD has a merit that the pixel areas can be most effectively utilized by flattening the surface of a semiconductor element and forming pixel electrodes thereon. Accordingly, the reflection type LCD utilizing the present invention can realize a high resolving power and a high aperture ratio.

EFFECT OF THE INVENTION

As described above, according to the present invention, the formation of hillocks by a heat treatment (cell-assembling step, etc.) after polishing pixel electrodes can be prevented by forming the pixel electrodes, heat-treating the pixel electrodes at the highest heating temperature in the heat treatment (cell assembling step, etc.) after polishing the pixel electrodes to form hillocks intentionally, forming an interlayer fabric thereon, removing the protrusions by mechanical polishing and also flattening the interlayer dielectric and the pixel electrodes.

Furthermore, as other effect of the present invention, by heat-treating the pixel electrodes to form hillocks and whiskers, the internal stress of the electrode films is removed, whereby the same effect (the effect of making a material anti-brittleness) as the case of tempering a metal can be obtained.

Thus, according to the present invention, pixel electrodes having a high light reflectance and a high anti-brittleness can be obtained, whereby the better reliance of the display images and more improved image quality can be obtained.

What is claimed is:

1. A method of manufacturing a semiconductor device, comprising the steps of:

forming a plurality of electrodes on an interlayer dielectric;

heat-treating the plurality of electrodes to form protrusions on surfaces of the plurality of electrodes; and removing the protrusions to flatten the surfaces.

2. A method of manufacturing a semiconductor device comprising at least a substrate having a plurality of semiconductor elements formed in a matrix form and a plurality of pixel electrodes each connected to each of the plurality of semiconductor elements, and a liquid crystal layer held on the substrate, comprising the steps of:

forming a plurality of pixel electrodes on an interlayer dielectric;

heat-treating the plurality of pixel electrodes to form protrusions on surfaces of the plurality of pixel electrodes, and removing the protrusions to flatten the surfaces.

3. A method of manufacturing a semiconductor device, comprising the steps of:

forming a plurality of electrodes on a first interlayer dielectric;

forming a second interlayer dielectric at least covering the plurality of electrodes, and flattening surfaces of the plurality of electrodes and a surface of the second interlayer dielectric, so that the surfaces of the plurality of electrodes and the surface of the second interlayer dielectric are in a same plane;

heat-treating the plurality of electrodes to form protrusions on the surfaces of the plurality of electrodes, and removing the protrusions to flatten the surfaces of the plurality of electrodes, wherein gaps among the plurality of electrodes are filled with the second interlayer dielectric.

4. A method of manufacturing a semiconductor device, comprising the steps of:

forming a plurality of electrodes on a first interlayer dielectric;

heat-treating the plurality of electrodes to form protrusions on surfaces of the plurality of electrodes;

forming a second interlayer dielectric at least covering the plurality of electrodes, and flattening the surfaces of the plurality of electrodes and a surface of the second interlayer dielectric, so that the surfaces of the plurality of electrodes and the surface of the second interlayer dielectric are in a same plane.

5. A method of claim 4 wherein the flattening step is a step of removing the protrusions from the surfaces of the plurality of electrodes and filling gaps among the plurality of electrodes with the second interlayer dielectric.

6. A method of claim 1 wherein temperature of the heat treatment is in a range of from 160 to 300° C.

7. A method of claim 2 wherein temperature of the heat treatment is in a range of from 160 to 300° C.

8. A method of claim 3 wherein temperature of the heat treatment is in a range of from 160 to 300° C.

9. A method of claim 4 wherein temperature of the heat treatment is in a range of from 160 to 300° C.

10. A method of claim 1 wherein the plurality of electrodes are composed of a material comprising aluminum as a main constituent.

11. A method of claim 2 wherein the plurality of electrodes are composed of a material comprising aluminum as a main constituent.

12. A method of claim 3 wherein the plurality of electrodes are composed of a material comprising aluminum as a main constituent.

13. A method of claim 4 wherein the plurality of electrodes are composed of a material comprising aluminum as a main constituent.

14. A method of claim 1 wherein the flattening step is carried out by mechanical polishing.

15. A method of claim 2 wherein the flattening step is carried out by mechanical polishing.

16. A method of claim 3 wherein the flattening step is carried out by mechanical polishing.

17. A method of claim 4 wherein the flattening step is carried out by mechanical polishing.

* * * * *